(12) United States Patent
Takekuma

(10) Patent No.: US 7,510,289 B2
(45) Date of Patent: Mar. 31, 2009

(54) LIGHT EMITTING DIODE AND LIGHT EMITTING CONTROL SYSTEM USING SAME

(75) Inventor: Akira Takekuma, Tokyo (JP)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 179 days.

(21) Appl. No.: 11/207,252

(22) Filed: Aug. 19, 2005

(65) Prior Publication Data
US 2006/0044815 A1 Mar. 2, 2006

(30) Foreign Application Priority Data
Sep. 1, 2004 (JP) .............................. 2004-253795

(51) Int. Cl.
G03B 15/02 (2006.01)
(52) U.S. Cl. .............................. 362/4; 362/11; 362/249; 362/800; 362/251; 257/99; 257/E33.058
(58) Field of Classification Search .................. 362/4, 362/11, 12, 18, 16, 231, 236, 276, 20, 254, 362/249, 252, 545, 555, 556, 566; 396/4, 396/61; 313/499, 500; 257/98–100, E33.026, 257/E33.058, E33.059
See application file for complete search history.

(56) References Cited

U.S. PATENT DOCUMENTS

| | | | | |
|---|---|---|---|---|
| 4,916,579 A | * | 4/1990 | Simms | 362/18 |
| 5,825,481 A | * | 10/1998 | Alofs et al. | 356/138 |
| 6,178,297 B1 | * | 1/2001 | Ting | 396/431 |
| 6,234,648 B1 | * | 5/2001 | Borner et al. | 362/235 |
| 6,330,055 B1 | | 12/2001 | Higashino | 356/3.06 |
| 6,425,678 B1 | * | 7/2002 | Verdes et al. | 362/244 |
| 6,900,953 B2 | * | 5/2005 | Okumura | 359/819 |
| 7,029,147 B2 | * | 4/2006 | Nawashiro | 362/236 |
| 7,046,926 B2 | * | 5/2006 | Chikugawa | 396/175 |
| 7,079,041 B2 | * | 7/2006 | Fredericks et al. | 340/815.45 |
| 7,152,996 B2 | * | 12/2006 | Luk | 362/240 |
| 2002/0006040 A1 | * | 1/2002 | Kamada et al. | 362/237 |
| 2004/0025337 A1 | * | 2/2004 | Walding et al. | 29/858 |
| 2004/0135504 A1 | * | 7/2004 | Tamaki et al. | 313/512 |
| 2004/0150744 A1 | | 8/2004 | Koyanagi | 348/371 |
| 2004/0170017 A1 | * | 9/2004 | Zhan et al. | 362/240 |
| 2004/0232825 A1 | * | 11/2004 | Sorg | 313/501 |
| 2005/0213958 A1 | * | 9/2005 | Uemura | 396/182 |
| 2005/0218306 A1 | * | 10/2005 | Schmidt et al. | 250/221 |

FOREIGN PATENT DOCUMENTS

| | | |
|---|---|---|
| JP | 2003-258307 | 9/2003 |
| JP | 2003-259196 | 9/2003 |
| JP | 2003-307771 | 10/2003 |
| JP | 2003-319405 | 11/2003 |

* cited by examiner

*Primary Examiner*—Ali Alavi
*Assistant Examiner*—Evan Dzierzynski

(57) ABSTRACT

A light emitting diode comprises light-emitting elements inside a cup structure and a lens part that condenses the light from these elements. Light-emitting element placed at the center along the optical axis of the lens emits an outgoing beam of light with a narrow directional angle along this optical axis, and light-emitting element placed away from the optical axis emits an outgoing beam of light in an oblique direction. The light-emitting elements are individually turned on and off in accordance with the distance of the subject to be photographed.

17 Claims, 5 Drawing Sheets

LIGHT EMITTING DIODE AND LIGHT EMITTING CONTROL SYSTEM USING SAME

1. FIELD OF THE INVENTION

The present invention relates to the use of light emitting diodes (LEDs), and in particular relates to light emitting diodes used as an auxiliary light source for autofocusing, and the like, when photographing with a camera and a system for controlling this light emission.

2. DISCUSSION OF THE BACKGROUND ART

The current digital still-shot cameras, and the like have an auxiliary light source for radiating auxiliary light and this is mounted on the autofocus mechanism for measuring distance or focusing. The contrast of a photographic subject can be improved and the autofocus operation can be appropriately performed, even in relatively dark places, by radiating auxiliary light onto the photographic subject with auxiliary light from the auxiliary light source.

A light emitting diode is a typical auxiliary light source (see, for example, JP (Kokai) [Unexamined Japanese Patent Publication] 2003-259,196; JP (Kokai) [Unexamined Japanese Patent Publication] 2003-319,405; and JP (Kokai) [Unexamined Japanese Patent Publication] 2003-258,307). A light emitting diode is small but capable of providing sufficient light without a flash. Consequently, it is effective as an auxiliary light source for digital cameras that must be small or other cameras mounted on a portable terminal.

By means of conventional light emitting diodes used as auxiliary light sources, the degree to which light is condensed is increased and center luminosity is also increased by providing the lens part, which is positioned overlapping the light emitting diode element, with predetermined dimensions and shape. As a result, the zoom ratio is increased and auxiliary light reaches the subject to be photographed even when photographing a subject that is relatively far away; therefore, the user can effectively use the autofocus function.

Nevertheless, when photographing a subject that is relatively close using a wide-angle lens, auxiliary light of a small directional angle does not hit near the center of the photographic range on the subject, and as a result, the distance of the subject cannot be known measured and effective autofocusing is not possible.

On the other hand, when the LED radiation range with a wide-angle lens is enlarged in order to cause some of the light to impinge near the center, it is not possible to effectively autofocus when photographing a subject that is relatively far away, as previously mentioned.

Therefore, the first object of the present invention is to provide a light emitting diode as an auxiliary light source capable of radiating auxiliary light near the center of a subject to be photographed, even with wide-angle photography of a subject that is relatively close, as well as a system for controlling the light emission of auxiliary light that is ideal for cameras that use this light emitting diode.

A second object of the present invention is therefore to provide a small auxiliary light source and a light emitting control system with which it is possible to keep energy consumptions constant and electrically turn on and off the radiation of auxiliary light onto a subject to be photographed.

SUMMARY OF THE INVENTION

The present invention provides a novel modified light emitting diode comprising light emitting diode elements, a cup in which the light-emitting elements are placed, and a lens part placed near this cup and it has a single optical axis for condensing the light from the light emitting diode elements, this light emitting diode characterized in that the light emitting diode elements comprise a first light emitting diode element, which is placed along the optical axis of the lens part and wherein the directional angle of outgoing light from the lens part when light has been emitted is 10° or less, and a second light emitting diode element, which is positioned inside the cup away from the optical axis and is turned on and off independently of the first light emitting diode.

The directional angle of outgoing light from the lens part when light has been emitted by the first and second light emitting diode elements can be virtually the same, or the directional angle when the second light emitting diode element emits light can be larger. For instance, the second light emitting diode element can be placed higher and closer to the lens part than the first light emitting diode element.

The present invention further provides a light emitting control system for autofocus auxiliary light of photographic equipment that uses the above-mentioned light emitting diode. The system comprises a light emitting diode as an auxiliary light source. The light emitting diode comprises light emitting diode elements inside a cup, and a lens part which is near the cup and is employed for condensing light from the light emitting diode elements. The light emitting diode elements comprise first and second light-emitting elements. The first light emitting diode element is placed along the center axis of the lens part and has a directional angle of 10° or less for outgoing light from the lens part when light has been emitted. The second light-emitting element is placed away from the center axis and is turned off and on independently of the first light emitting diode element. When the light emitting diode elements are in juxtaposition with photographic components, the second light emitting diode element is placed away from the photographic components along the axis connecting the photographic components and the first light emitting diode element. The system comprises a remote sensor. Either the first or the second light emitting diode element or both elements are illuminated based on information from the remote sensor.

The remote sensor has photographic components of photographic equipment and a zoom adjustment mechanism that works with these photographic components. The remote sensor is made such that at least of the zoom ratios used by the zoom adjustment mechanism, the first light emitting diode element lights at a high zoom ratio, while the second light emitting diode element lights at a low zoom ratio.

The system can also further comprise a luminous energy sensor. It can be made such that if the luminous energy detected by the luminous energy sensor is not a threshold value, both the first and second light emitting diode elements are illuminated. The luminous energy sensor can be included in the photographic components.

BRIEF DESCRIPTION OF THE DRAWINGS

FIG. 3 is a drawing that explains the radiation effect of the light emitting diode in the first and second embodiments. (a)

is a drawing showing the radiation range of the light emitting diode elements at the center intersecting with the lens axis in each embodiment, and (b) shows the radiation range of the light emitting diode elements away from the lens axis.

DETAILED DESCRIPTION OF THE PREFERRED EMBODIMENT

Preferred embodiments of the light emitting diode and the system comprising the same of the present invention will now be described in detail while referring to the attached drawings. A preferred embodiment of the structural characteristics of the light emitting diode will be described first and then the effects of these characteristics and the system comprising this diode will be described.

Figure 1:
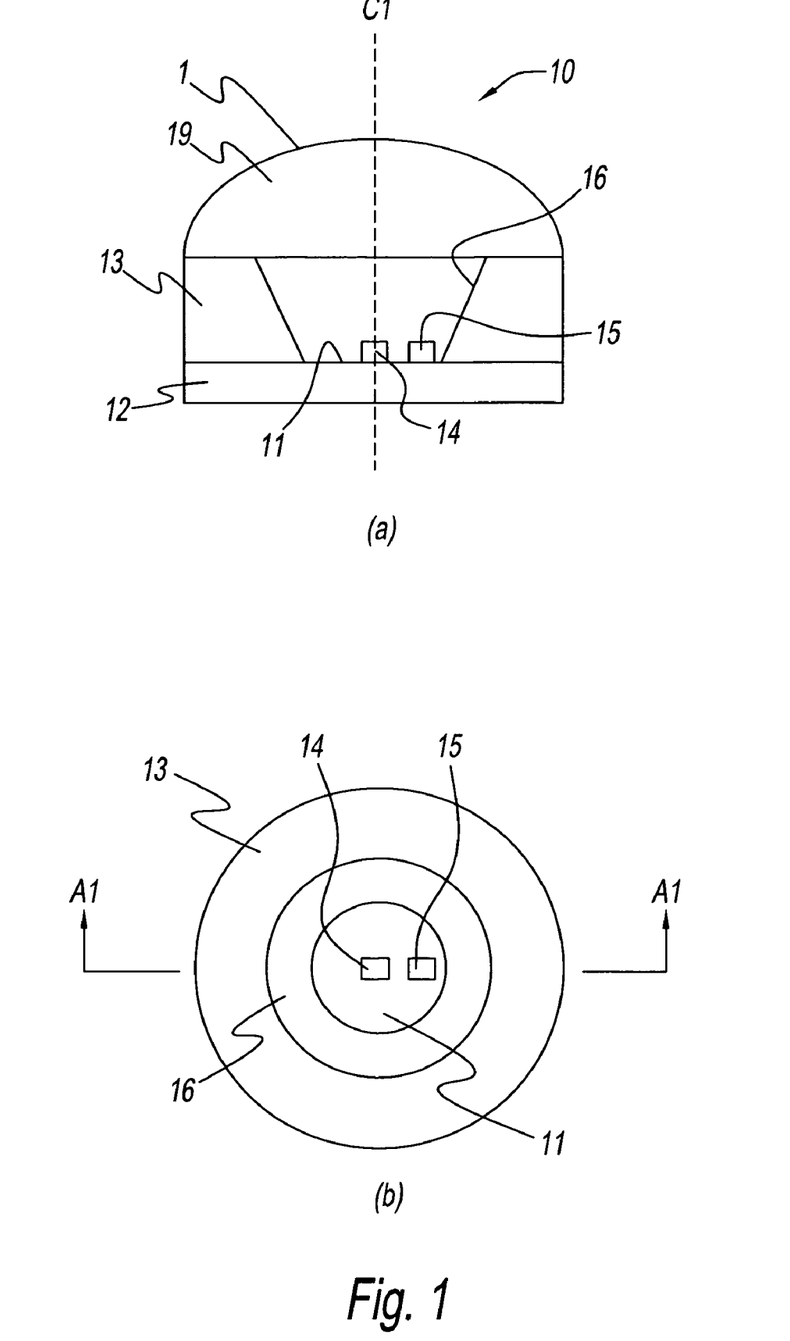
FIG. 1 is a drawing of a first preferred embodiment of the present invention. (a) is the cross section of the light emitting diode along arrow A1 in (b) and (b) is a plan view of this light emitting diode.

FIG. 1 is a drawing showing the first preferred embodiment of the light emitting diode of the present invention. (a) is a cross section of the light emitting diode along arrow A1 in (b). (b) is a plan view of this light emitting diode.

A light emitting diode 10 comprises a substrate 12, a frame 13 on top of substrate 12, two light emitting diode elements 14 and 15 mounted on substrate 12, a resin layer 17 made from a transparent resin filled into an opening part 16, and a lens part 19, which is made from a transparent resin and demarcates a dome structure at the top of frame 13 and resin layer 17. Light-emitting elements 14 and 15 are typically light emitting diode chip elements and they are electrically connected to the circuit pattern at top surface 11 (not illustrated) of substrate 12 by soldering or via bonding wire.

Opening part 16, which together with top surface 11 of substrate 12 demarcates a cup-shaped structure, is made in frame 13 and the light-emitting elements 14 and 15 are placed on top surface 11 of the substrate inside of this opening part 16. Resin layer 17 encloses both light-emitting elements 14 and 15. Lens part 19 has axial symmetry around axis C1. Light-emitting element 14 is placed intersecting with axis C1, but light-emitting element 15 is placed away from axis C1. As illustrated, opening part 16 is inclined such that it comes closer to axis C1 as it moves toward the base. Light-emitting element 15 is placed closer to the base edge of opening 16 than is light-emitting element 14.

Figure 2:
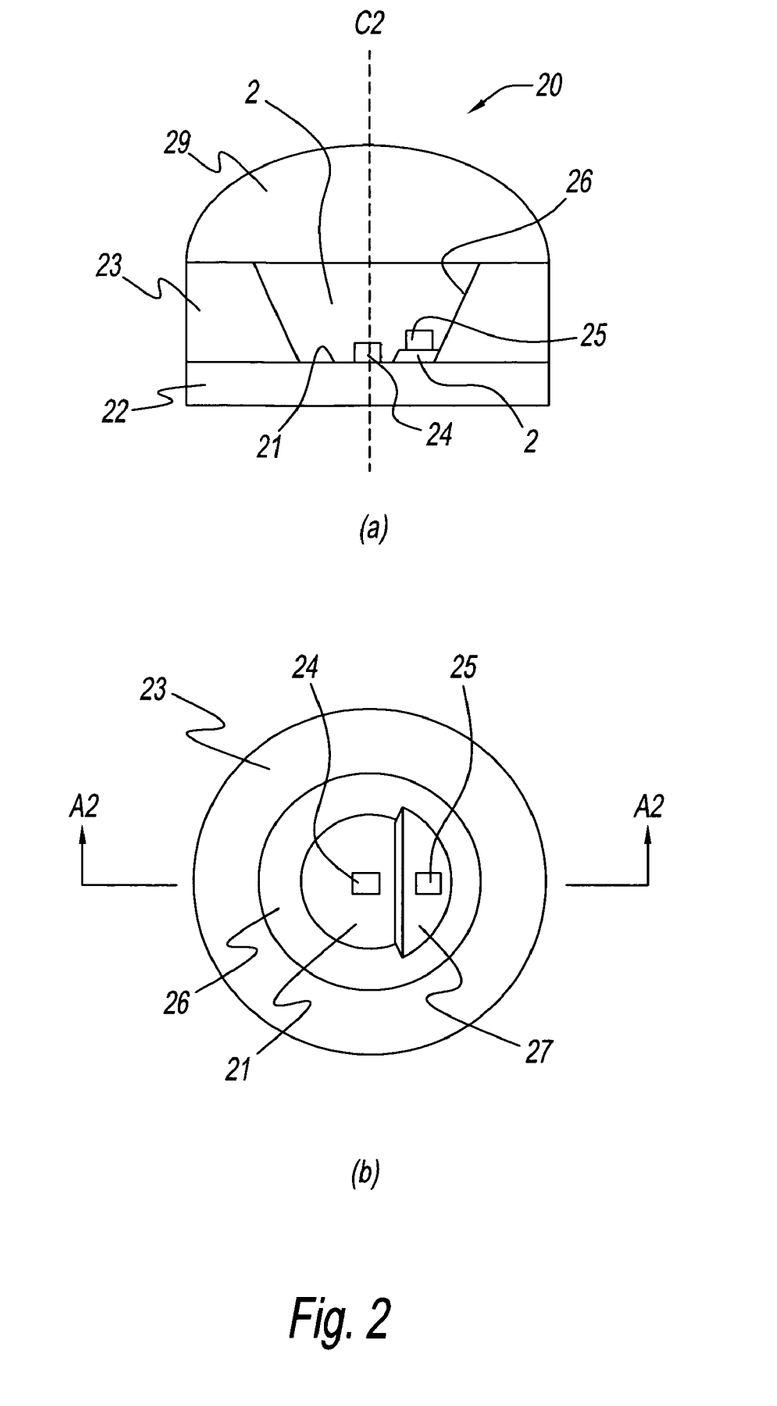
FIG. 2 is a drawing of a first preferred embodiment of the present invention. (a) is the cross section of the light emitting diode along arrow A1 in (b) and (b) is a plan view of this light emitting diode.

FIG. 2 is a figure showing a second preferred embodiment of the light emitting diode of the present invention. (a) is a cross section of the light emitting diode along arrow A2 in (b). (b) is a plan view of this light emitting diode.

Light emitting diode 20 also comprises a substrate 22, a frame 23 on top of substrate 22, light-emitting elements 24 and 25 placed inside an opening part 26 on the inside of frame 23, a resin layer 27 made from a transparent resin filled into opening 26, and a lens part 29, which is made from transparent resin and demarcates a domed structure at the top of frame 23 and resin layer 27. Light-emitting element 14 is placed intersecting with symmetry axis C2 of dome part 29 at top surface 21 of substrate 22 as in the first embodiment. The difference from the first embodiment is that light-emitting element 25 is placed on a platform 28 rather than on top surface 21 of substrate 22. Platform 28 can be molded as one unit with frame 23 or it can be separately molded and anchored later.

Light-emitting elements 24 and 25 are typically LED chips. Light-emitting element 24 is electrically connected to the circuit pattern on top surface 21 of substrate 22 (not illustrated) by soldering or with bonding wire as in the first embodiment. On the other hand, light-emitting element 25 and the circuit pattern can be connected by wire bonding or via a pattern formed on the surface of frame 27.

Figure 3:
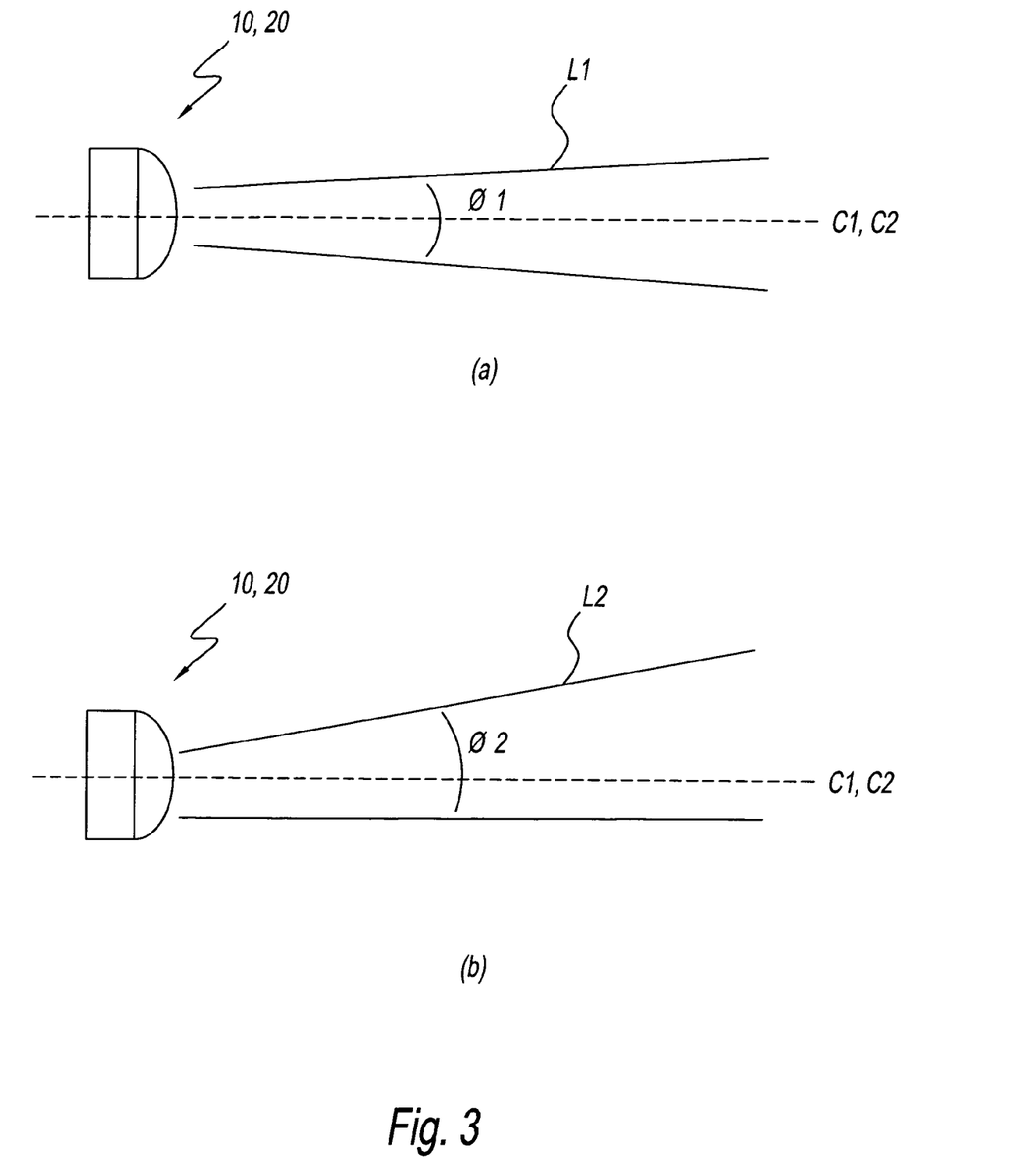

FIG. 3 is a drawing explaining the effects of radiation by the light emitting diodes of the first and second embodiments. (a) shows the radiation range of the light emitting diode element at the center intersecting with the axis of the lens in each embodiment and (b) shows the radiation range of the light emitting diode element placed away from the lens axis.

As shown in FIG. 3 (a), light L1 from light-emitting elements 14 and 24 placed at the center is mainly condensed by lenses 19 and 29 (refer to FIGS. 1 and 2) to become outgoing light directed in a relatively narrow range. Light emitting diodes 10 and 20 of the first and second embodiments are ideal auxiliary light for autofocusing of camera equipment because even if the subject to be photographed is relatively far away, it is necessary to increase the condensed state of the light to obtain the desired luminous energy. The outside surface of lens 19 has the curvature needed to condense the light and as a result, directional angle $\Phi 1$ shown in (a) is brought to 10° or less, preferably 6° or less.

On the other hand, as shown in FIG. 3 (b), light L2 from light-emitting elements 15 and 25 placed away from the sensor becomes an outgoing beam inclined toward the center but away from the position of light-emitting elements 15 and 25 due to reflection at openings 16 and 26 (refer to FIGS. 1 and 2) and the condensing effects of lenses 19 and 29 (refer to FIGS. 1 and 2). As shown in the figures, the directional angle $\Phi 2$ of light from light-emitting elements 15 and 25, which are placed away from the center, is the same as directional angle $\Phi 1$ of light from light-emitting elements 14 and 24, which are placed at the center, and can usually be brought to 10° or less. However, the shape of lenses 19 and 29 can be determined such that angle $\Phi 2$ is larger than $\Phi 1$. The emission wavelength of light-emitting elements 15 and 25 can be the same as that of light-emitting elements 14 and 24, or it can be different.

Figure 4:
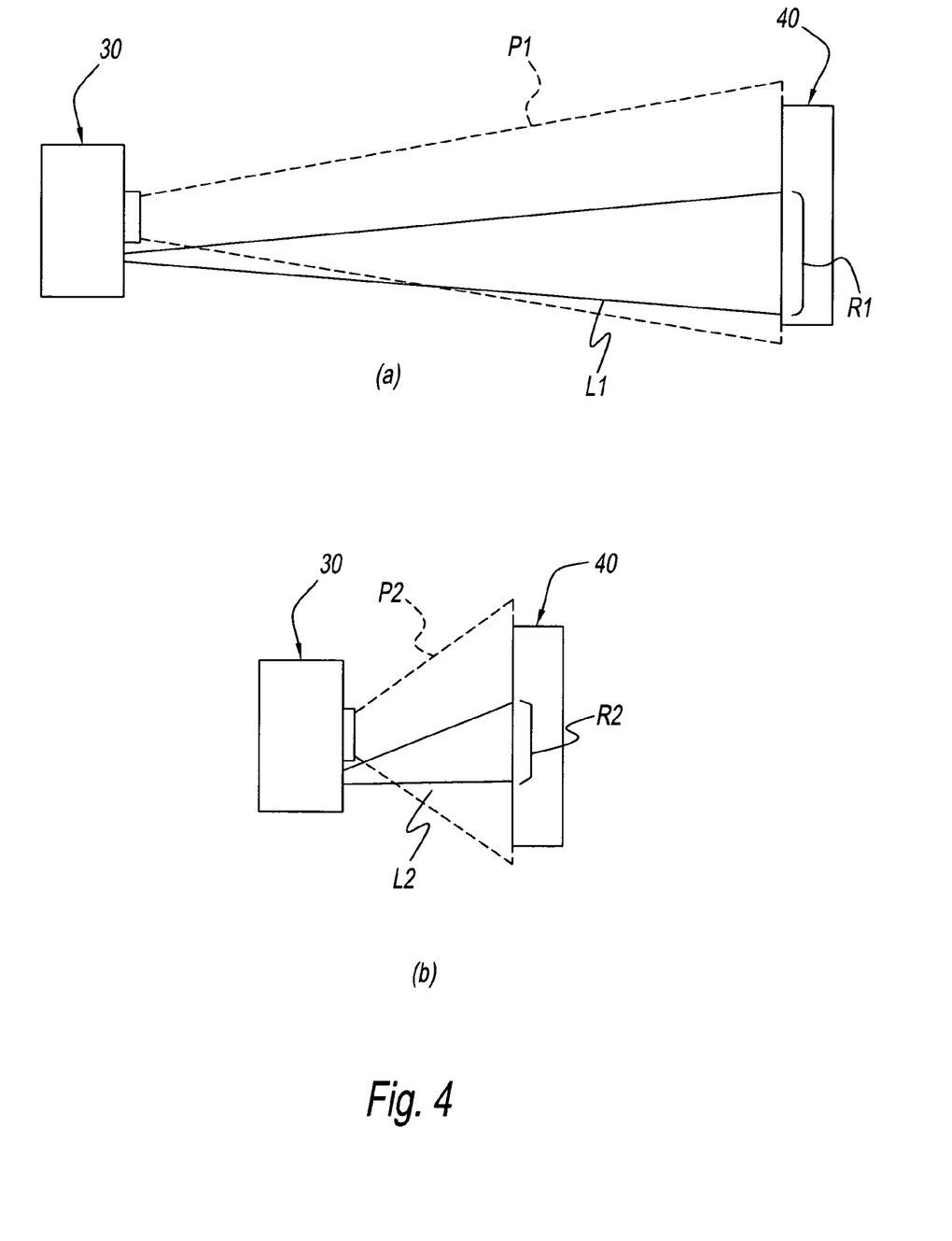
FIG. 4 is a drawing that explains the radiation effect of the light emitting diodes when the light emitting diodes are mounted on a camera. (a) is the case where the subject to be photographed is relatively far away, and (b) is the case where the subject to be photographed is relatively close.

FIG. 4 is a drawing that describes the radiation effect of light emitting diodes when the light emitting diodes have been placed on the camera. (a) is the case where the subject to be photographed is relatively far away and (b) shows the case where the subject to be photographed is relatively close. Reference 30 is the camera and 40 is the subject to be photographed. Broken lines P1 and P2 between camera 30 and the subject to be photographed 40 show the photographic range, while solid lines L1 and L2 show the radiation range of light from light emitting diodes as in FIG. 3.

As shown in FIG. 4 (a), when the subject to be photographed 40 is relatively far away, it is necessary to increase the condensed state of the light and sufficiently increase the luminous energy that reaches the subject to be photographed. In particular, video information of the subject to be photographed near the center of photographic range P1 is often used for autofocusing; therefore, it is necessary to guarantee sufficient luminous energy near the center of the photographic range. Taking the properties shown in FIG. 3 into consideration, light-emitting elements 14 and 24 at the center are turned on. As a result, radiation range R1 can overlap near the center of photographic range P1 on the subject to be photographed 40 and the information of the detected subject to be photographed 40 can be used for autofocusing.

On the other hand, and shown in FIG. 4 (b), when the subject to be photographed 40 is relatively close, that is, when photographing at a relatively wide angle, it is necessary to radiate light near the center of the subject to be photographed. As is clear from the properties shown in FIG. 3, it is difficult to include sufficient surface area near the center of photographic range P2 of the subject to be photographed 40 at a relatively close position within radiation range L1. Therefore, the light that is used is light emitted from light-emitting elements 15 and 25 whose radiation range is biased to one side. As shown in FIG. 4 (b), the light from light-emitting elements 15 and 25 can overlap radiation region R2 near the center of photographic range P2 on the subject to be photographed 40 that is relatively close, and the information of the subject to be photographed 40 detected from this irradiation region R2 can be used for auto focusing.

It should be noted that in order to realize the effect of FIG. 4, the direction in which the light-emitting elements are aligned with the photographic components should be a single straight line when the light emitting diodes are mounted on camera equipment, and light emitting diode elements 15 and 25 should be oriented and anchored such that they are farther away from the photographic components than light-emitting elements 14 and 24.

Figure 5:
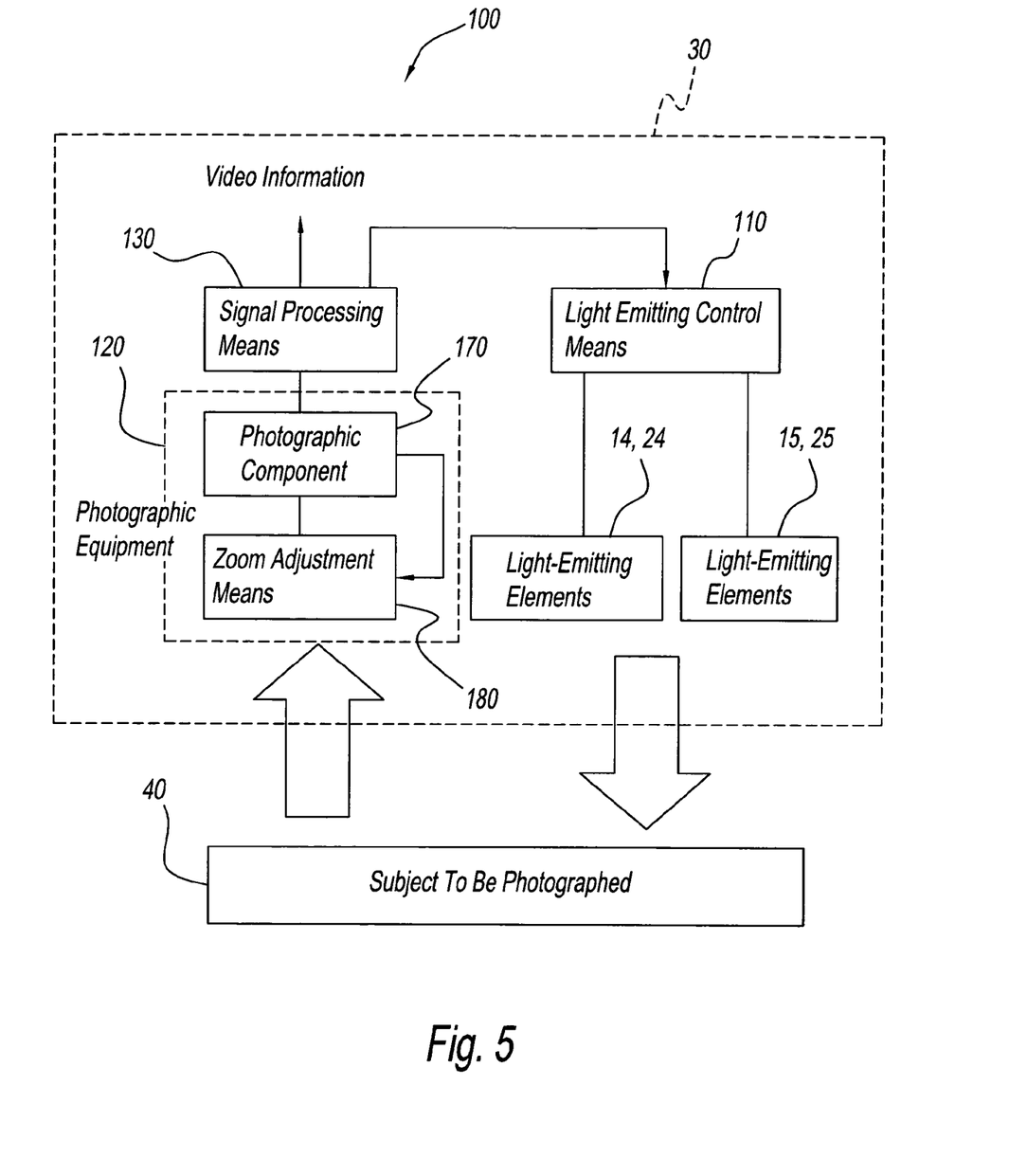
FIG. 5 is a block diagram describing the automatic light emitting control system for auxiliary light that uses the light emitting diode in FIG. 1 or 2.

FIG. 5 is a block diagram describing an automatic light emitting control system for auxiliary light that uses the above-mentioned light emitting diodes. A system 100 comprises a light emitting control means 110 for turning on and off light-emitting elements 14 and 24 placed at the center and light-emitting elements 15 and 25 placed away from the center; photographic equipment 120, which is employed for capturing the video information from the subject to be photographed 40 and has a range-finding function; and a signal processing means 130, which is capable of processing signals from photographic equipment 120, outputting distance information to light emission control means 110, and outputting the final video information to a separate line. These elements that make up the system are housed inside a camera 30 as shown in the figure.

Photographic equipment 120 has a photographic component 170 and a zoom adjustment mechanism 180 that has an autofocus function for focusing based on information detected by photographic component 170. The zoom adjustment means can comprise an autofocus function, for instance, a module with a movable lens placed close to the photographic component, and means for controlling this module.

By means of the first photographic step, information from photographic equipment 120 (that is, information on the zoom ratio) is received by signal processing means 130 as a result of a coarse autofocusing in a short period of time. Using the threshold or another value as the criterion, signal processing means 130 roughly evaluates whether the subject to be photographed 40 is relatively far or relatively close based on this information. Then in the second step, light emission control means 110 receives information of the distance evaluation output from signal processing means 130, and when it is determined that the subject to be photographed 40 is relatively far away, only light-emitting elements 14 and 24 placed at the center are turned on and allowed to emit light. Vice versa, when it is determined that the subject to be photographed 40 is relatively close, only light-emitting elements 15 and 25, which are placed away from the center, are turned on and allowed to emit light. By means of the third step, photographic equipment 120 takes the photograph once the autofocus function has accurately focused in on the subject to be photographed 40, which is irradiated by light-emitting elements 14, 24, 15, and 25. In the fourth step, the resulting information is processed by signal processing means 130 such that it can be output.

By means of the first photographic step, information on the luminous energy around the subject to be photographed 40 detected by photographic equipment 120 can be combined and processed by signal processing means 130 and this information can be output to light emitting control means 110 together with distance information. During the second step, light emitting control means 110 turns on both light-emitting elements 14 and 24 placed at the center and light-emitting elements 15 and 25 placed away from the center when information is received that luminous energy is insufficient, regardless of whether the subject to be photographed 40 is relatively far away or relatively close. Thus, it is possible to supplement luminous energy that is insufficient for autofocusing. There can be separate sensors for detecting luminous energy.

Light emitting control means 110 is not only controlled by information 10 from signal processing means 130; it can also be controlled by direct operation of a user. The user can guarantee radiation from light-emitting elements 14 and 24 and 15 and 25 under special circumstances in accordance with such additional modes.

Preferred embodiments of the light emitting diode and system comprising the same of the present invention have been described in detail, but these are only examples and various modifications by persons skilled in the art are possible.

What is claimed is:

1. A light emitting diode (LED), comprising:
   a cup
   a lens mounted on a top portion of the cup;
   a first light emitting diode chip located inside the LED on the cup and along an optical axis of the lens, and wherein the directional angle of light emitted by the first light diode chip and directed through the lens is 10° degrees or less; and
   a second light emitting diode chip located inside the LED on the cup and placed away from the optical axis and is turned on and off independently of the first light-emitting diode chip.

2. The light emitting diode according to claim 1, wherein said second light emitting diode chip is positioned at a height closer to the lens part than the first light emitting diode chip.

3. A light emitting control system for the autofocus auxiliary light of photographic equipment that uses a light emitting diode, said light emitting diode comprising:
   a cup;
   a lens mounted on a top portion of the cup;
   a first light emitting diode element, which is placed inside the cup along a center axis of the lens and wherein the directional angle of light emitted by the first light diode element and directed through the lens is 10° degrees or less; and
   a second light emitting diode element, which is placed away from the center axis and is turned on and off independently of the first light emitting diode; the second light emitting diode element is placed away from the photographic equipment along the axis that joins the photographic equipment and the first light emitting diode element;
   said light emitting control system further comprising a distance sensor, wherein at least one of said first light emitting diode element and said second light emitting diode element are activated based on the information of this distance sensor.

4. The light emitting control system according to claim 3, wherein said distance sensor comprises a photographic component of the photographic equipment and a zoom adjustment mechanism that works together with the photographic component.

5. The light emitting control system according to claim 4, wherein said first light emitting diode element is activated when the zoom ratio used at least by the zoom adjustment mechanism is high and the second light emitting diode element is activated when the zoom ratio is low.

6. The light emitting control system according to claim 3, further comprising a luminous energy sensor, wherein both said first and second light emitting diode elements are activated when the luminous energy detected by the luminous energy sensor is less than a threshold value.

7. The light emitting control system according to claim 6, wherein said luminous energy sensor is part of the photographic equipment.

8. A light emitting diode (LED), comprising:
   a substrate located inside the LED;
   a first light emitting diode chip mounted inside the LED on the substrate for emitting light along a central optical axis of the LED;
   a platform mounted on the substrate at a location away from the central optical axis; and
   a second light emitting diode chip mounted inside the LED on the platform for emitting light along an off-central optical axis of the LED.

9. The light emitting diode of claim 8, wherein the platform is an independently molded assembly having a configuration selected for anchoring the platform upon the substrate.

10. The light emitting diode of claim 9, wherein the second light emitting diode chip mounted on the platform is electrically coupled to the substrate by a bonding wire.

11. The light emitting diode of claim 9, wherein the first and second light emitting diode chips are provided independent electrical coupling thereby enabling independent operation of the first and second light emitting diode chips.

12. The light emitting diode of claim 8, further comprising:
    a frame mounted on the substrate; and
    a lens mounted on the frame, the lens configured to provide a first directional angle for light propagating from the first light emitting diode chip along the central optical axis, and further configured to provide a second directional angle for light propagating from the second light emitting diode chip along the off-central optical axis, the second directional angle being different than the first directional angle.

13. The light emitting diode of claim 12, wherein the platform is an integral part of the frame.

14. The light emitting diode of claim 13, wherein the frame comprises an electrical bonding pattern for providing an electrical coupling to the second light emitting diode chip mounted on the platform.

15. The light emitting diode of claim 12, wherein the frame comprises a cup-shaped aperture housing the first light emitting diode chip mounted on the substrate and the second light emitting diode chip mounted on the platform.

16. The light emitting diode of claim 12, wherein the cup-shaped aperture is at least partially filled with a transparent resin.

17. The light emitting diode of claim 16, wherein the lens is a dome made of a second transparent resin that is in contact with the resin contained in the cup-shaped aperture.

* * * * *

UNITED STATES PATENT AND TRADEMARK OFFICE
CERTIFICATE OF CORRECTION

PATENT NO.         : 7,510,289 B2
APPLICATION NO.    : 11/207252
DATED              : March 31, 2009
INVENTOR(S)        : Akira Takekuma It is certified that error appears in the above-identified patent and that said Letters Patent is hereby corrected as shown below:

Column 6, Line 29 (approx.), Claim 1, after "cup" insert --;--.

Column 6, Line 34 (approx.), Claim 1, delete "10° degrees" and insert --10 degrees--.

Column 6, Line 52, Claim 3, delete "10° degrees" and insert --10 degrees--.

Signed and Sealed this
Twenty-eighth Day of December, 2010

David J. Kappos
*Director of the United States Patent and Trademark Office*